United States Patent

Ohta et al.

Patent Number: 5,972,106
Date of Patent: Oct. 26, 1999

[54] DEVICE AND METHOD FOR PRODUCING SINGLE CRYSTAL

[75] Inventors: Tomohiko Ohta; Susumu Sonokawa, both of Nishishirakawa; Satoshi Soeta, Takefu; Yoshihiro Kodama, Nakakubiki, all of Japan

[73] Assignee: Shin-Etsu Handotai Co., LTD., Tokyo, Japan

[21] Appl. No.: 08/776,776

[22] PCT Filed: Dec. 8, 1995

[86] PCT No.: PCT/JP95/02514

§ 371 Date: Feb. 10, 1997

§ 102(e) Date: Feb. 10, 1997

[87] PCT Pub. No.: WO97/21853

PCT Pub. Date: Jun. 19, 1997

[51] Int. Cl.⁶ .................................................. C30B 15/20
[52] U.S. Cl. .............................. 117/13; 117/15; 117/216; 117/217; 117/218; 117/222
[58] Field of Search ................................ 117/13, 15, 216, 117/217, 218, 222

[56] References Cited

U.S. PATENT DOCUMENTS 5,720,810  2/1998  Arai et al. ................................ 117/221

FOREIGN PATENT DOCUMENTS

| B2-57-40119 | 3/1982 | Japan . |
| 62-138386 | 6/1987 | Japan . |
| 63-315589 | 12/1988 | Japan . |
| 64-65086 | 3/1989 | Japan . |
| 3-153595 | 7/1991 | Japan . |
| 5-105578 | 4/1993 | Japan . |
| B2-5-35715 | 5/1993 | Japan . |
| 5-330975 | 12/1993 | Japan . |
| 6-48884 | 2/1994 | Japan . |
| 6-135792 | 5/1994 | Japan . |
| 07069779A | 3/1995 | Japan . |

OTHER PUBLICATIONS

"Ways for Cleaning Wafer and Problems of Manufacturers of Semiconductors", Edt. Editorial Committee of Urgent Report of ULSI Production Technology, pp. 58–70, Dec. 20, 1993, 1ˢᵗ Impression of 1ˢᵗ Edition.

*Primary Examiner*—Felisa Hiteshew
*Attorney, Agent, or Firm*—Oliff & Berridge, PLC

[57] ABSTRACT

A device and method for producing single crystals by the Czohralski method can control the temperature distribution and thermal history of single crystals to improve the production efficiency and quality of single crystals. The device includes a cylinder coaxially surrounding a single crystal pulling rod, having an upper end airtightly connected to the ceiling of a pulling chamber and a lower end close to the surface of a melt in a crucible. A heat insulating element is attached to the lower end of the cylinder, and is surrounded by a surface of the crystal, the inside wall of the crucible and the surface of the melt. The heat insulating element is sized to occupy 30–95% by volume of the space above the melt, and the space has a height corresponding to the radius of the crystal. The heat insulator has a sufficient heat insulating effect, so that even if the diameter of single crystals is increased, the pulling speed of the crystals does not need to be lowered, the uniformity of temperature of the entire crystal-melt interface is improved, and the ratio of single crystallization is not reduced.

18 Claims, 4 Drawing Sheets

DEVICE AND METHOD FOR PRODUCING SINGLE CRYSTAL

BACKGROUND OF THE INVENTION

1. Technical Field

The present invention relates to a device and method for producing a single crystal, in particular, a device for producing a single crystal by pulling it by the Czochralski method in which the temperature distribution and thermal history of a pulling single crystal are controlled to improve the production efficiency of single crystals and the qualities thereof, and a method for producing a single crystal by using the device.

2. Background Art

In recent years, high- integration and high- precision of semiconductor devices are more and more advanced, and wafers of semiconductor crystals are becoming larger in diameter and higher in quality. Such semiconductor crystals are mainly produced by the Czochralski method (the pulling method), in which various efforts to produce semiconductor crystals having further large diameter and high quality are made.

Figure 4:
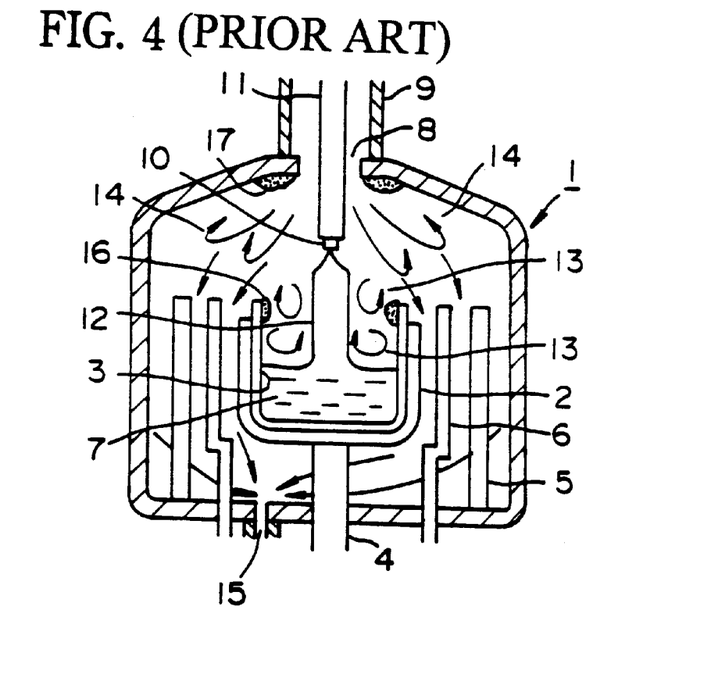
FIG. 4 shows a schematic sectional view of a conventional device by the Czochralski method.

For example, explaining such a case that a silicon single crystal rod is produced by the Czochralski method as shown in FIG. 4, a pulling chamber (a metal chamber) 1 is provided with a quartz crucible 3 in the middle, the quartz crucible 3 being supported by a graphite susceptor 4 which is supported at the center of the bottom by a supporting shaft 4 which is rotatable and up- and- down movable. The quartz crucible is filled with a raw material, polycrystalline silicon, which is heated and melted by a graphite heater 6 surrounded with a heat insulating cylinder 5 to give melt 7. The pulling chamber 1 has an opening part 8 in the middle of the ceiling thereof, to which a sub- chamber 9 is connected. A pulling shaft 11 which is rotatable and up-and- down movable and holds a seed 10 at the end is moved down through the sub- chamber 9, thereby the seed 10 is dipped into the melt 7, and subsequently the seed 10 is pulled with rotating the pulling shaft 11 and the quartz crucible 3, thereby a single crystal rod 12 can be grown following the end part of the seed 10. The problems arising when single crystal rods are produced by such a conventional Czochralski method are as follows: First, in pulling a crystal, a protective gas such as, for example, argon gas, is introduced from the upper part of the sub- chamber 9 and discharged from a discharge outlet 15. The gas to be introduced is extremely highly pure, but in the pulling chamber a reaction between the quartz crucible 3 and the silicon melt 7 takes place so that vapor of SiO occurs from the surface of the melt 7, the vapor of SiO being present in the upper part of the inside space of the pulling chamber 7. Most of the vapor of SiO flows downward and is discharged from the discharge outlet 15, but a part thereof is deposited as aggregate of fine powders in a form of layers or masses on such places as those having relatively low temperatures such as an inside wall 16 of the upper part of the quartz crucible 3 or an inside wall 17 of the upper part of the pulling chamber 7, when any turbulent flows 13, 14 are present in the upper part of the inside space of the chamber 7 or around the single crystal rod 12 and the surface of the melt 7. The deposited SiO falls down on the surface of the melt in pulling a single crystal and attaches to the interface of growing the crystal, which results in dislocation of the pulling single crystal rod.

Furthermore, in the pulling chamber, a reaction between carbon materials such as the graphite susceptor 2, the graphite heater 6, the heat insulating cylinder 5 (for example, made of graphite felt) and the like and the above- mentioned SiO or the quartz crucible takes place so that a CO gas occurs. When the turbulent flows 13, 14 are present in the upper part of the inside space of the pulling chamber 7 and around the single crystal rod 12 and the surface of the melt 7, the CO gas flows downward and comes into contact with the surface of the melt, which results in the increase of the concentration of carbon in a pulling single crystal silicon rod and the deterioration of the characteristics of integrated circuit devices on the wafers produced from the single crystal rod.

The pulling speed of the single crystal rod 12 is dependent on a temperature gradient of the single crystal rod on the crystal- melt interface, the temperature gradient being greatly affected by the radiant heat from the graphite susceptor 2, the quartz crucible 3, the surface of the melt and the like to the crystal. In order to improve the productivity of single crystal rods, the pulling speed of the single crystal rod should be as fast as possible. However, if the diameter of a single crystal to be pulled is larger, the latent heat for crystallization as well as the above- mentioned radiant heat are increased so that the pulling speed of the crystal is decreased and the productivity thereof is also remarkably lowered. If a crystal to be pulled is larger in diameter, it becomes difficult to uniform the temperature of the entire crystal- melt interface so that the ratio of single crystallization is decreased and the yield of single crystals is remarkably reduced.

Regarding qualities of crystals, for example, in a case where integrated circuit devices are formed on a wafer of a silicon single crystal, oxidation induced stacking faults (hereinafter, referred to as OSF's), swirl defects and other microdefects are easily formed in a thermal oxidation process, which lead to the deterioration of the characteristics of integrated circuit devices. Using any conventional devices by the Czochralski method, however, it is difficult to completely suppress the generation of these defects, this tendency being more remarkable, in particular, with the diameter of crystals to be pulled becoming larger.

Moreover, the requirements for the qualities of semiconductor crystals become severer with high- integration and high- precision of semiconductor devices being advanced in recent years, so that further high purity, lower level of defect generation and uniformity of single crystals are required. In particularly recent years, it has been proved that not only the higher purity of raw materials and higher cleanness of members of a device used for the production of a single crystal and higher precision of the device but also the thermal history of a growing single crystal has a great influence on the generation of crystal defects and the like. For silicon crystals, for example, it has been confirmed that the levels of OSF's, oxide precipitates, BMD's (bulk microdefects), FPD's (flow pattern defects), LSTD's (laser scattering tomography defects) and COP's (crystal originated particles) as well as various characteristics such as a dielectric breakdown voltage and the like are affected by the thermal history. For compound semiconductors such as GaP, GaAs, InP and the like, it has been confirmed that the dislocation density and the level of defects which function as a donor or an accepter are greatly influenced by the thermal history. Accordingly, some devices having various structures of the inside of the pulling chamber have been proposed in order to adjust the thermal history of a growing crystal to control the levels of any defects therein, but it is not possible to highly precisely control the thermal history by using such devices.

The following proposals have been made in order to solve the above- mentioned problems:

i) Japanese Patent Publication (KOKOKU) 57-40119

Figure 5:
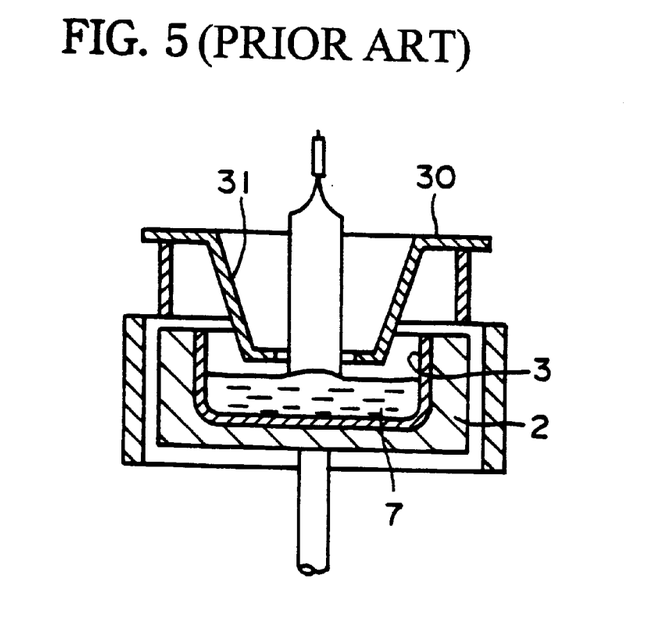
FIG. 5 shows a schematic sectional view of another conventional device by the Czochralski method in which a crucible and melt are partly covered.

It describes a device for pulling a single crystal in which a crucible 3 and melt 7 therein are partly covered, as shown in FIG. 5, wherein it is provided with a member comprising a flat and circular rim 30, which is above a crucible 3 and projects from the edge of the crucible 3, and a connecting part 31, which is attached to the inside edge of the rim 30 and is in a form of a cylinder or a tapering cone, the inside height of the connecting part 31 being 0.1 to 1.2 times as long as the depth of the crucible 3.

ii) Japanese Patent Laid- Open (KOKAI) 64-65086

Figure 6:
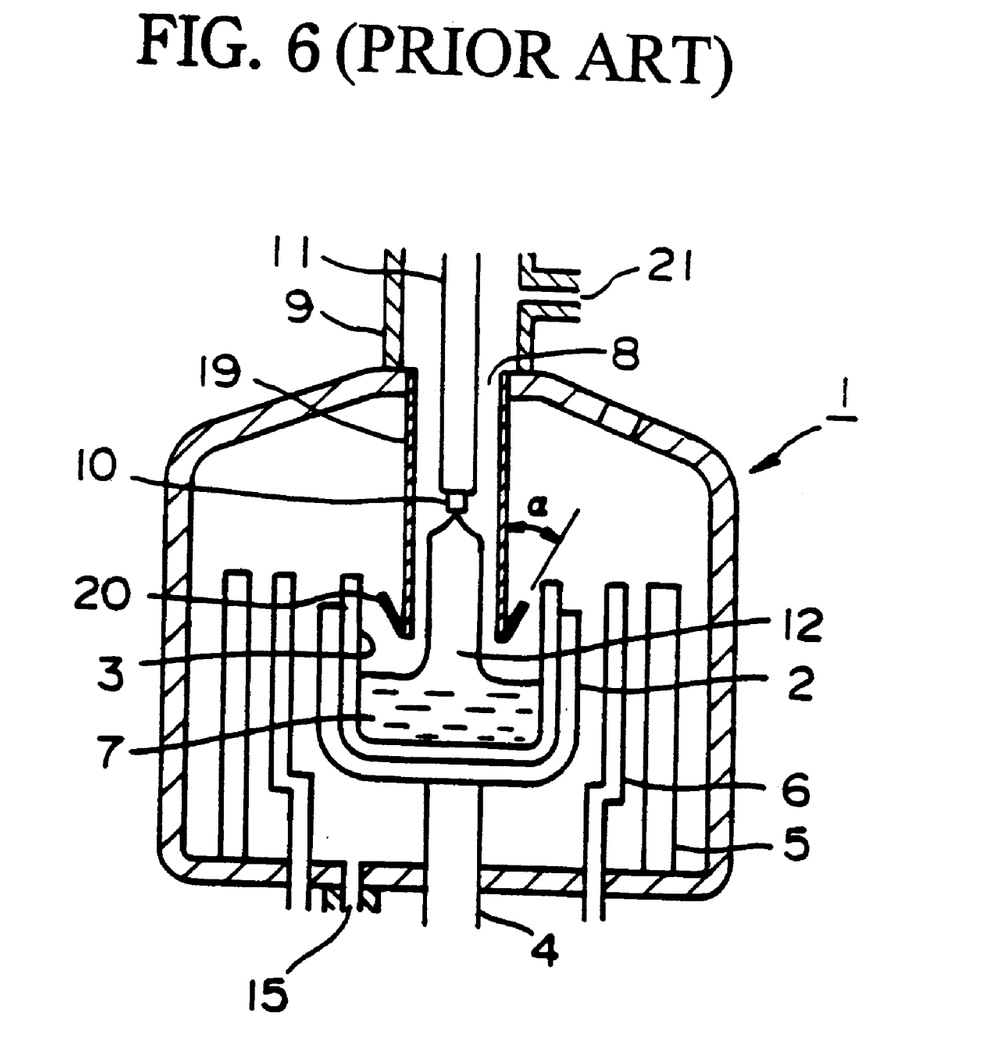
FIG. 6 shows a schematic sectional view of a further conventional device by the Czochralski method which is provided with a collar.

It describes a device for producing a single crystal rod, as shown in FIG. 6, wherein it is provided with a cylinder 19 coaxially surrounding a pulling single crystal rod 12, one end of the cylinder 19 being airtightly connected to the edge of the outlet in the middle of the ceiling of a pulling chamber and the other end thereof facing the surface of melt 7 in a quartz crucible 3 and being provided with a collar 20 which is formed by turning up outside and spreading.

These devices have such effects as the increase of the pulling speed, the suppression of SiO precipitates falling into silicon melt, the suppression of generation of OSF's, etc. to some extent. However, they are unsatisfactory under further increase in a desired diameter (in case of silicon single crystals, that are 8 inches or more) and further heightening of the desired qualities of single crystals in recent years.

That is, regarding the device under i), any measures against new requirements for qualities which become problems in recent years, such as a level of OSF's and a dielectric breakdown voltage are not taken, and in the device under i) the covering member is in fact made of relatively thin metal plate, which has a low effect of insulating a pulling single crystal from the radiant heat, so that the device under i) is not suitable for pulling single crystals having a large diameter such as 8 inches or more. Furthermore, since the connecting part 31 which surrounds a single crystal and is in a form of a tapering cone has a low inside height, the crystal, after it is not surrounded with the connecting part 31 in a pulling process, emits radiant heat directly to the metal chamber cooled by water so that it is not capable of controlling the temperature distribution and thermal history of the crystal, and the upper part of the inside space of the pulling chamber is broad so that turbulent flows 14 occur which bring about various harmful influences.

The device under ii) has the cylinder 19 coaxially surrounding a pulling single crystal rod, one end of the cylinder 19 being airtightly connected to the edge of the outlet in the middle of the ceiling of a pulling chamber and the other end thereof facing the surface of melt 7 in a quartz crucible and being provided with a collar 20 which is formed by turning up outside and spreading, so that the straightening effect of a protective gas and the effect of keeping the temperature of a crystal or cooling a crystal are improved in comparison with the device under i), but, since the collar 20 is relatively small and made of thin material, the device under ii) has also only insufficient effects of insulating the crystal from the radiant heat in pulling a single crystal having a large diameter in recent years. In the device under ii), it is possible of adjusting the thermal history of the pulling crystal to some extent by adjusting a spread angle α of the collar 20, but the range capable of adjusting the thermal history is narrow, and such highly precise and extremely minute control of the thermal history as satisfies all of various qualities of crystals which are required in recent years is not possible.

As mentioned above, since the conventional devices have only an insufficient effect of insulating a crystal from the radiant heat, the range capable of adjusting the thermal history and temperature distribution of crystals is very narrow, so that the change of design of the device for producing a single crystal including the change of the inside structure of the chamber is required every time the diameter of a crystal to be pulled is changed, this meaning a disadvantage of doing all over again.

SUMMARY OF THE INVENTION (Problems to be Solved by the Invention)

This invention was made on the basis of such backgrounds and the object thereof is to provide a device and a method for producing a single crystal which, even if the diameter of a single crystal to be pulled is increased, has a sufficient effect of insulating the crystal from the radiant heat, and in which the pulling speed of the crystal is not lowered, the uniformity of temperature of the entire crystal-melt interface is improved and the ratio of single crystallization is not reduced, and which is capable of easily and precisely controlling the thermal history and temperature distribution of the crystal.

(Measure for Solving the Problems)

The above- described problems is solved according to the invention in that a device is provided with a cylinder, which coaxially surrounds a pulling single crystal rod, and the upper end of which is airtightly connected to the ceiling of a pulling chamber and the lower end thereof is close to the surface of melt in a crucible and provided with a heat insulating means much larger than the conventional one, the heat insulating means being surrounded by the surface of the crystal, the inside wall of the quartz crucible and the surface of the melt, and, occupying 30% by volume to 95% by volume of the space above the melt and having such a height as corresponding to the radius of the pulling crystal. The device has a sufficient effect of insulating the pulling crystal from the radiant heat and, if the heat insulating means is removably attached to the lower end of the cylinder, is capable of suitably adjusting and controlling the thermal history of the crystal corresponding to the purpose by changing the size, the shape, the material, the inserting material of the heat insulating means.

That is, the first aspect of the present invention provides a device for producing a single crystal by the Czochralski method which is provided with a cylinder coaxially surrounding a pulling single crystal rod, the upper end thereof being airtightly connected to the ceiling of a pulling chamber and the lower end thereof being close to the surface of melt in a crucible, characterized in that a heat insulating means is attached to the lower end of the cylinder, the heat insulating means being surrounded by the surface of the crystal, the inside wall of the crucible and the surface of the melt, and, having such a size as occupying 30% by volume to 95% by volume of the space that is above the melt and has a height corresponding to the radius of the pulling crystal.

Since the device of the present invention pulling single crystal surrounding a pulling single crystal rod, the upper end thereof being airtightly connected to the ceiling of a pulling chamber and the lower end thereof being close to the surface of melt in a crucible, it has a high effect of straightening a protective gas so that any turbulent flows does not occur therein. Therefore, in the device, such problems as dislocation of a pulling single crystal by deposit of SiO powder and contamination of the crystal by CO gas flowing downward do not occur, and keeping the temperature of the crystal or cooling of the crystal can be carried out in the upper part of the inside space of the pulling chamber by adjusting the diameter of the cylinder, the material thereof, the amount of the protective gas, etc. Furthermore, since the pulling speed of a single crystal, non-dislocation of a single crystal having a large diameter, the qualities of a single crystal due to the thermal history, etc. are greatly affected by the gradient and the uniformity of the temperatures of the crystal-melt interface and the pulling crystal at such a height as corresponding to the radius of the pulling crystal above the melt following the crystal-melt interface, in the device of the present invention, a large heat insulating means is attached to the lower end of the cylinder, which is surrounded by the surface of the crystal, the inside wall of the crucible and the surface of the melt, and, which has such a size as occupying 30% by volume to 95% by volume of the space above the melt and having such a height as corresponding to the radius of the pulling crystal. Therefore, the device has a high effect of insulating the crystal from radiant heat from the surface of the melt, the quartz crucible, etc. since the radiant heat is almost received by the heat insulating means, and in the device the thermal history and temperature distribution of the pulling crystal can be controlled by the shape and the like of the heat insulating means.

The reason why the size of the heat insulating means is defined as 30% by volume to 95% by volume is that in case of less than 30% by volume the insulating effect is insufficient like the conventional device, and in case of more than 95% by volume the heat insulating means comes into contact with the crucible or the melt and in fact the production of single crystals is impossible.

The second aspect of the present invention provides a device for producing a single crystal, characterized in that the heat insulating means and the cylinder are removable from each other.

If the heat insulating means is removable as described above, the heat insulating means can be changed at any time to that having different size, shape and the like corresponding to the diameter of a crystal to be pulled, the inside diameter of the crucible and the other structures of the inside of the pulling chamber, so that the pulling speed of the crystal, the thermal history, etc. can be uniform or changed.

The third aspect of the present invention provides a device for producing a single crystal, characterized in that the heat insulating means comprises an outside shell having a hollow in which heat insulating material can be inserted.

If the heat insulating means comprises an outside shell having a hollow in which heat insulating material can be inserted as described above, the temperature distribution of the crystal can be changed by not only the shape and size of the heat insulating means but also the nature thereof by inserting various heat insulating material having different thermal conductivity into the hollow, so that further minute and precise control of the thermal history and temperature distribution of the crystal is possible.

The forth aspect of the invention provides a device for producing a single crystal, characterized in that the outside shell is made of graphite, SiC-coated graphite, SiC or $Si_3N_4$, and carbon fiber, glass fiber, tungsten, niobium, tantalum or molybdenum is inserted into the hollow or the hollow is as it is.

The outside shell is preferably made of graphite, SiC-coated graphite, SiC or $Si_3N_4$ because the shell is directly exposed by the vapor of SiO and the radiant heat from the surface of the melt and the like so that a shell made of metals, etc. is easily damaged. Furthermore, various materials can be inserted into the hollow which is protected by the outside shell, so that the heat insulating means having different thermal conductivity can be made by inserting such materials as having low thermal conductivity, for example, carbon fiber, glass fiber, etc., alternatively, such metals as having a high melting point, for example, tungsten, niobium, tantalum, molybdenum, etc., into the hollow, or without inserting anything.

The fifth aspect of the present invention provides a device for producing a single crystal, characterized in that the shortest distances between either of the cylinder and the heat insulating means, and, the surface of the melt, the crystal and the inside wall of the crucible are 5 mM to 50 mm, 5 mm to 150 mm and 5 mm to 150 mm, respectively.

The reason why the shortest distances are defined as described above is that in case of the above distances being less than 5 mm the single crystal rod starts a little eccentric movement in pulling thereof, or, the inside wall of the cylinder comes into contact with the crystal if the control of the diameter of the crystal is insufficient, or, the cylinder or the heat insulating means comes into contact with the melt or the quartz crucible if vibration of the surface of the melt or a little change of the shape of the crucible under a high temperature takes place, this leading to the impossibility of pulling the crystal after that If the above distances are too narrow, the flow of a protective gas is not uniform or the linear velocity thereof is too rapid, this causing eccentric movement of the crystal or vibration of the surface of the melt which causes dislocation of the pulling single crystal. On the other hand, if the distance between the cylinder or the heat insulating means and the surface of the melt is more than 50 mm, the heat insulating effect on the part of single crystal immediately after solidifying is insufficient, so that it is difficult to attain such a desired purpose as adjusting the temperature distribution of the crystal. If the distance between the cylinder or the heat insulating means and the crystal or the crucible is more than 150 mm, the flow speed of the protective gas which flows therebetween is reduced, this leading to the lowering of the effect of straightening and discharging SiO and CO by the protective gas as well as the waste of the protective gas.

In case where silicon single crystals having a further large diameter such as 12 inches or more are produced, the above suitable ranges of the shortest distances may be varied so that in the first and second aspects of the present invention the shortest distances are not restricted to the above ranges.

The sixth to ninth aspects of the present invention provides a method for producing a single crystal, characterized by using the above-mentioned device of the first or second aspect;

a method for producing a silicon single crystal, characterized by using the above-mentioned device of the first or second aspect;

a method for controlling temperature distribution and thermal history of a pulling crystal, characterized by using the above-mentioned device of the first or second aspect; and a method for controlling temperature distribution and thermal history of a pulling crystal, characterized by using the above-mentioned device of the third aspect.

The first to third aspects of the invention provide a device which has an improved heat insulating effect by employing a cylinder coaxially surrounding a pulling single crystal rod, the lower end of the cylinder being close to the surface of melt in a crucible and provided with a heat insulating means much larger than the conventional one, and furthermore which is capable of suitably adjusting and controlling the thermal history of a pulling crystal according to the purpose by removably attaching the heat insulating means to the lower end of the cylinder thereby the size, shape, material and inserting material of the heat insulating means are properly changed.

Accordingly, using this device, a single crystal, even if it is large in diameter, can be produced under a sufficient heat insulating effect, without reduction of the pulling speed, with uniformity of the temperature of the entire crystal- melt interface, without reduction of the ratio of single crystallization, under easy and precise control the thermal history and temperature distribution of the crystal.

As a result, if a single crystal is produced by using this device, a single crystal which sufficiently meets high requirements for qualities in recent years can be obtained; this is the tenth aspect of the present invention.

The following explanation of the present invention will be made for the production of 8- inch or more diameter silicon single crystals as examples, but the present invention is not restricted to these. The present invention is also useful for production of compound semiconductors and oxide single crystals by the Czochralski method, and can be also applied to production of not only crystals having further large diameter such as 12- inch or more crystals, but also silicon single crystals less than 8 inch in diameter.

PREFERRED EMBODIMENTS OF THE INVENTION

The present invention will be described in further detail with reference to the accompanying drawings.

Figure 1:
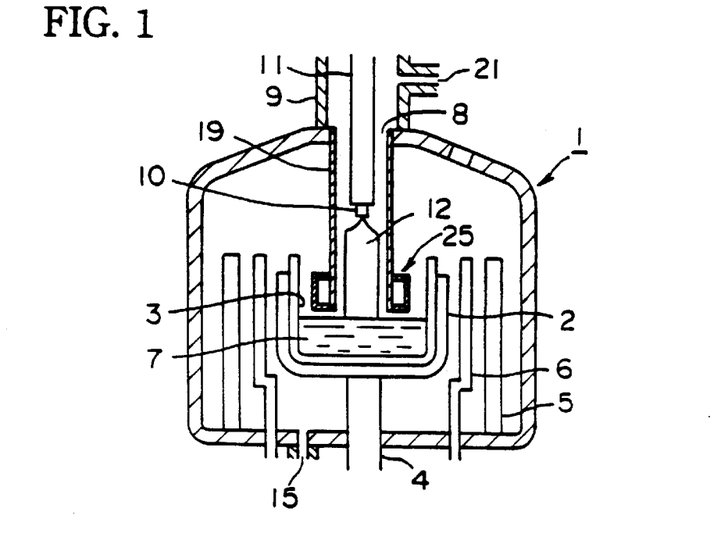
FIG. 1 shows a schematic sectional view of a typical device by the Czochralski method of the present invention employing a heat insulator.
Figure 2A:
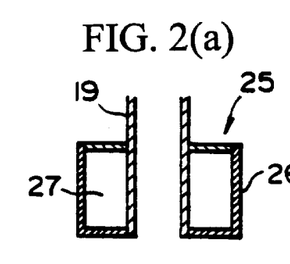
FIGS. 2(a)–2(f) show a sectional view of various embodiments of the heat insulator of the present invention.
Figure 2B:
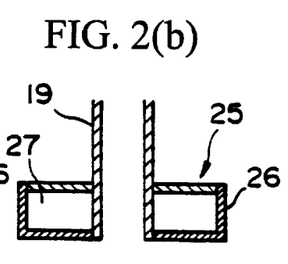
Figure 2C:
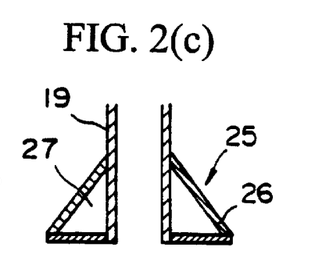
Figure 2D:
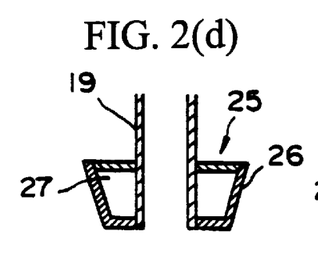
Figure 2E:
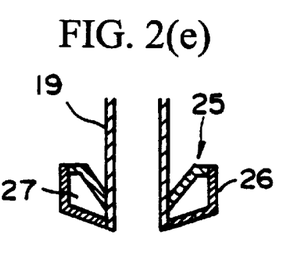
Figure 2F:
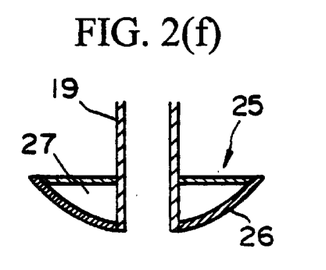

FIG. 1 shows an embodiment of a device of the present invention. In FIG. 1, the numeral 1 indicates a pulling chamber 1, which is, in the middle, provided with a quartz crucible 3 supported by a graphite susceptor 2, the graphite susceptor being supported at the center of the bottom by a supporting shaft 4 which is rotatable and up- and- down movable. The pulling chamber 1 has an opening part 8 in the middle of the ceiling thereof, to which a sub-chamber 9 is connected. The pulling chamber is further provided with a pulling shaft 11 which is rotatable and up- and- down movable through the sub- chamber, and a cylinder 19, the upper end of the cylinder being airtightly connected to the edge of the opening part 8 and the lower end of the cylinder is close to the surface of melt 7. The lower end of the cylinder is provided with a heat insulator 25, which is surrounded by the surface of the crystal, the inside wall of the crucible and the surface of the melt, and, which occupies 30% by volume to 95% by volume of the space that is above the melt and has a height such a height as corresponding to the radius of the pulling crystal. The upper part of the sub-chamber 9 has an inlet 21 for introducing a protective gas and the bottom of the pulling chamber has an outlet 15 of the protective gas.

The connection of the upper end of the cylinder 19 to the edge of the opening part 8 is not necessarily required to be highly airtight, and the cylinder 19 may be removably attached to the edge of the opening part 8 and it is acceptable that a protective gas introduced into the cylinder flows out to some extent from the connection part. The cylinder 19 is not restricted to be cylindrical, and may be in such a form as spreading or tapering downward. The material of the cylinder 19 may be heat- resistant material such as graphite, SiC- coated graphite, SiC, $Si_3N_4$, etc. Materials having multilayer structure made of these materials, which have an improved heat insulating effect, can be also used. Heat-resistant metal materials may be also used if any measure not to contaminate a single crystal rod by metal is taken.

The temperature of a single crystal rod in pulling is dependent on heat transmission from the crystal- melt interface, and the heat radiation from the surface of melt and the crucible. The heat transmission from the crystal- metal interface can not be prevented and controlled, so that the temperature distribution is decided by control of the heat radiation. The heat insulator 25 according to the present invention is surrounded by the surface of the crystal, the inside wall of the quartz crucible and the surface of the melt, and is very large and occupies 30% by volume to 95% by volume of the space above the melt and having such a height as corresponding to the radius of the pulling crystal. Therefore, the heat radiation directly from the surface of the melt, the quartz crucible, etc. is almost interrupted by the heat insulator 25, so that the temperature of the crystal is decided by the indirect radiant heat through the heat insulator 25 and the cylinder 19. The pulling speed of a crystal, obtaining dislocation-free crystals having large diameter, the qualities of crystals due to the thermal history which are problems in recent years, etc. are greatly affected by the gradient and uniformity of the temperature of the crystal-melt interface and the pulling crystal at such a height as corresponding to the radius of the pulling crystal above the melt following the crystal- melt interface, so that the thermal history and temperature distribution of the crystal can be controlled by adjusting the heat insulator 25, which leads to the improvement of the efficiency of crystal production and qualities of produced crystals.

An additional effect of such a large heat insulator 25 is to increase the temperature of a point of contact between the inside wall of the quartz crucible and the surface of the melt 7 in pulling a single crystal which has a large diameter and thus prevent the melt from solidifying from this point. In order to pull a single crystal having a large diameter, a quartz crucible having a large inside diameter is necessary as a crucible for producing it. However, the increase of the inside diameter of the quartz crucible leads to the increase of the surface area of the melt 7 and the increase in emission of the radiant heat from the surface of the melt. As a result, the temperature of the point of contact between the inside wall of the quartz crucible and the surface of the melt 7 tends to lower and the solidification of the melt from the inside wall of the quartz crucible having such a lower temperature starts, so that in some cases it is impossible to pull the single crystal 12 after that.

In contrast, since the device of the present invention has the heat insulator 25, the radiant heat from the surface of the melt is absorbed by the heat insulator 25 and the temperature of the point of contact between the inside wall of the quartz crucible and the surface of the melt 7 is not lowered by the radiant heat from the heat insulator itself so that the solidification of the melt from the inside wall of the quartz crucible does not occur.

The heat insulating effect of the heat insulator 25 can be varied by the material, etc. thereof. Therefore, the temperature can be varied by exchanging a heat insulator for another one having a different heat insulating effect. Therefore, the heat insulator 25 is removably attached to the cylinder 19. The combination therebetween is made by a conventional manner such as screwing or inserting.

In the device according to the present invention, it is possible to use a heat insulator 25 having various structures, the typical examples of which are shown in FIGS. 2 (*a*) to (*f*). The whole of the heat insulator 25 may be made of a single material, but in this case the heat insulating effect can be adjusted only by changing the whole shape and the size thereof, this meaning that exchange of the heat insulator 25 itself is necessary for adjusting the heat insulating effect, which is uneconomical. Accordingly, in the device according to the present invention, a heat insulator having an outside shell 26 and a hollow 27 in which heat insulating material can be inserted is preferably used.

If the heat insulator 25 has such a structure as having the outside shell 26 and the hollow 27 in which heat insulating material can be inserted, the temperature distribution of the pulling crystal can be varied not only by the shape and size of the heat insulator 25 but also, if heat insulating material having different thermal conductivity is inserted in the hollow 27, by the nature of the inserted material, so that it is possible to further minutely and precisely control the thermal history and temperature distribution of the pulling crystal.

In this case, the outside shell 26 of the heat insulator 25 is preferably made of graphite, SiC- coated graphite, SiC or $Si_3N_4$. The reason thereof is that the outside shell 26 of the heat insulator is directly exposed to the radiant heat from the surface of melt, etc. and the temperature thereof is increased, and additionally, the outside shell 26 is also directly exposed to the vapor of SiO, therefore the surface of the outside shell 26 is liable to be damaged and the heat insulator made of metal, etc. has a problem regarding durability. On the other hand, various materials for inserting the hollow 27 which is protected by the outside shell can be used if those have heat resistance and do not contaminate the inside of the pulling chamber by any reaction, etc. Such materials as having low thermal conductivity, for example, carbon fiber, glass fiber, etc., may be inserted, alternatively, such metals as having high thermal conductivity, for example, tungsten, niobium, tantalum, molybdenum,etc., may be inserted, or nothing may be inserted into the hollow 27. The heat insulator 25 having different thermal conductivity can be made by inserting various materials having different thermal conductivity into the hollow 27.

Furthermore, in the device of the present invention, the shortest distances between either of the cylinder 19 and the heat insulator 25, and, the surface of the melt 7, the crystal 12 and the inside wall of the crucible 3 are preferably 5 mm to 50 mm, 5 mm to 150 mm and 5 mm to 150 mm, respectively.

In such a device, the space above the melt 7 surrounded by the cylinder 19 and the quartz crucible 3 is remarkably limited in comparison with the case where the heat insulator 25 is not attached, and, when the protective gas introduced through the space between the cylinder 19 and the single crystal rod 12 arrives at the surface of the melt 7 and is turned round there and discharged to the outside of the quartz crucible 3, the resistance time of the protective gas above the surface of the melt 7 is shortened, and the protective gas is passed through the narrow space between the inside wall of the quartz crucible 3 and the outside wall of the heat insulator 25 at a relative high speed and flows so as to wash the inside wall of the quartz crucible and the outside wall of the heat insulator, therefore dislocation of the pulling crystal due to deposit of SiO on the upper end part of the quartz crucible which is a problem in the prior art does not take place. Moreover, CO gas which occurs by reacting the graphite susceptor 2, the heater 6, the heat insulating cylinder 5, and the like with SiO or the quartz crucible 3 in the pulling chamber 1 can be prevented from flowing backward to contaminate the silicon melt 7 by carbon The distances therebetween should not be less than 5 mm. The reason is that in case of the above distances being less than 5 mm the single crystal rod 12 starts a little eccentric movement in pulling thereof, or, the inside wall of the cylinder 19 comes into contact with the crystal rod 12 if the control of the diameter of the crystal rod 12 is insufficient, or, the cylinder 19 or the heat insulator 25 comes into contact with the melt 7 or the quartz crucible 3 if vibration of the surface of the melt 7 or a little change of the shape of the crucible under a high temperature takes place, this leading to the impossibility of pulling the crystal after that If the above distances are too narrow, the flow of the protective gas is not uniform or the linear velocity of the gas flow is too rapid, this causing eccentric movement of the crystal rod 12 or vibration of the surface of the melt 7 which causes dislocation of the pulling single crystal in some cases. On the other hand, if the distance between the cylinder 19 or the heat insulator 25 and the surface of the melt 7 is more than 50 mm, the heat insulating effects on the part of single crystal immediately after solidifying is insufficient, so that it is difficult to adjust the temperature distribution of the crystal. If the distance between the cylinder 19 or the heat insulator 25 and the crystal 12 or the crucible 3 is more than 150 mm, the flow speed of the protective gas which flows therebetween is reduced, this leads to the lowering of the effect of straightening and discharging SiO and CO by the protective gas.

EXAMPLES i) Example 1

Raw material, polycrystalline silicon of 100 kg was charged into a 22- inch diameter quartz crucible (the inside diameter: 550 mm) which is used for pulling a 8- inch diameter silicon single crystal rod (the outside diameter: 210 mm) by the Czochralski method, and the temperature distribution of the crystals above the melt was measured by using a conventional device and the device of the present invention to inquire into the difference of the temperature distribution thereof. The results are shown in FIG. 3.

Figure 3:
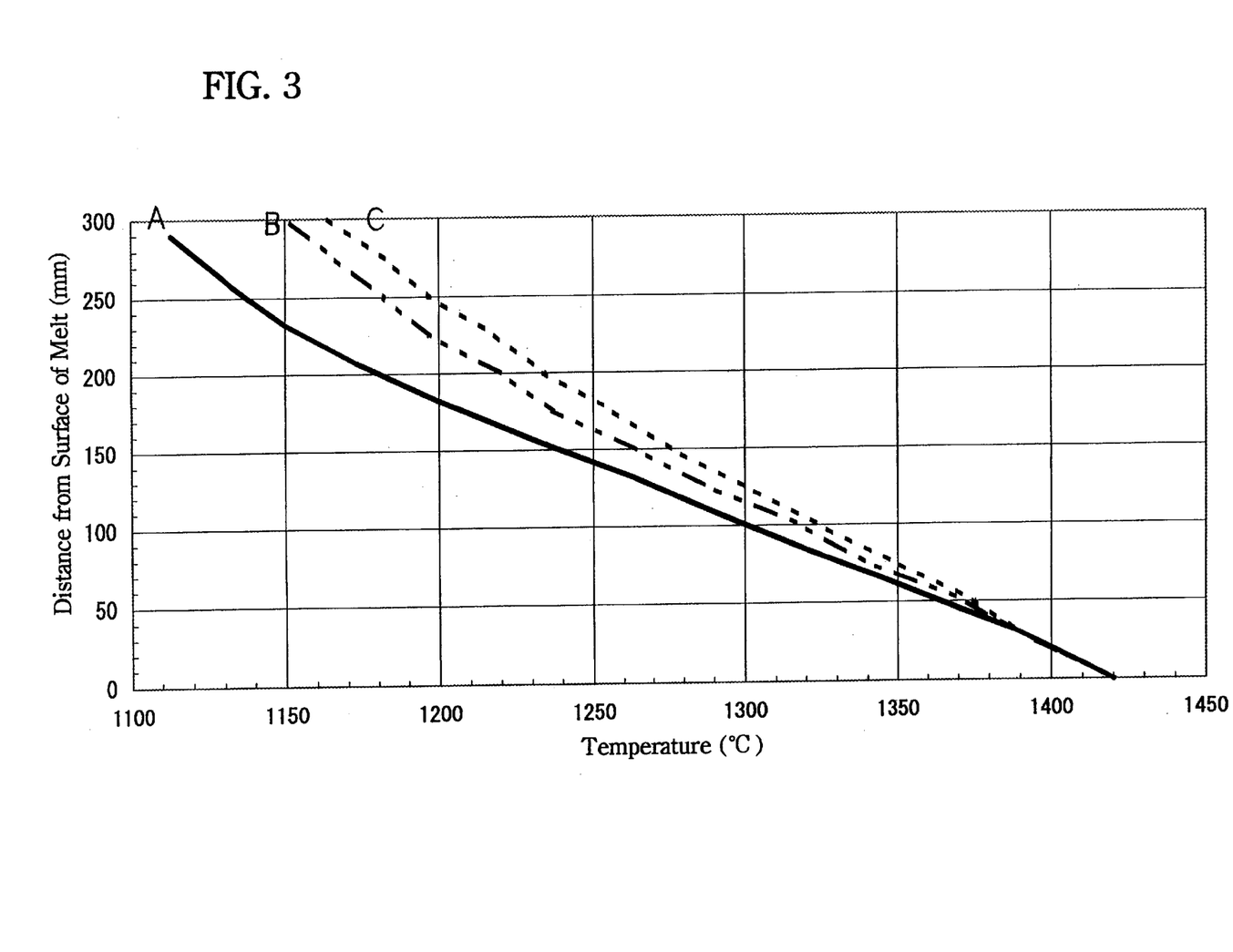
FIG. 3 shows a graph showing measurements of temperature distribution of a crystal above the surface of melt.

Curve C in FIG. 3 is the case where the conventional type of device shown in FIG. 6 was used. Curve C shows that the temperature of the crystal is high due to insufficiency of the heat insulating effect of the conventional device. Curve A in FIG. 3 is the case where the device according to the present invention was used. Curve A shows that the temperature of the crystal is lower than that shown by Curve C, this meaning the device of the present invention has a superior heat insulating effect In the device of the present invention, the cylinder 19 and the outside shell 26 of the heat insulator were made of isotropic graphite and the hollow 27 was filled with carbon fiber as a heat insulating material. The distances between either of the cylinder 19 and the heat insulator 25, and the surface of melt and the inside wall of the crucible were 30 mm and 40 mm, respectively. The inside diameter of the lower end of the cylinder 19 was 270 mm. Then, in order to minutely adjust the heat insulating effect of the heat insulator 25, the material wasing material was removed from the hollow 27 and then any material was not inserted in the hollow. The temperature of the crystal was measured in the same manner as described above except for filling of the heat insulating material. The results are shown as Curve B in FIG. 3, which shows that it is possible to minutely adjust the temperature of the crystal.

ii) Example 2

Silicon single crystal rods having 8- inch diameter and <100>- orientation were pulled by using the devices corresponding to the above Curves A and C. The results are shown in the following table.

As seen from the results, the 8-inch diameter silicon single crystals produced by the device according to the present invention show better results on the all items of tests in comparison with those produced by the conventional device. In particular, the silicon single crystals produced by the device according to the present invention have the improved thermal history, so that the pulling speed thereof was faster and the qualities thereof were improved.

TABLE

|  | Example of Present Invention (A) | Conventional Example (C) |
| --- | --- | --- |
| Produced Rod Number | 20 | 20 |
| Yield of Non-Dislocated Single Crystal (%)*¹ | 73 | 65 |
| Average Pulling Speed of Single Crystal Rod (mm/min) | 1.02 | 0.81 |
| Ratio of Good Wafers on OSF's (%)*² | 100 | 61 |
| Average Number of COP's (per wafer)*³ | 12 | 33 |

*¹The yield is represented by the ratio of the weight of the non-dislocated part of the single crystals after removing the dislocated part to the weight of the raw material polycrystals.
*²The crystal rods were sliced into silicon wafers, and the wafers were subjected to the thermal treatment at 780° C. for 3 hours and 1000° C. for 16 hours, and then to preferential etching, the wafers having the standard value or less of defects of OSF's was defined as good wafers on OSF's. The ratio of good wafers on OSF's is a ratio of the number of good wafers on OSF'sto the number of all wafers.
*³If the surface of silicon wafers after polishing is cleaned by aquous ammonia and hydrogen peroxide to remove particles on the surfaces of the wafer, pits are formed on the surface from the defects formed in growing the crystal. When the number of particles on the surface of the wafer are determined by a particle counter, not only true particles but also the pits are detected asparticles. Such a pit is referred to as "COP (Crystal Originated Particle)" to distinguish it from true particles. If the number of COP's is increased, the dielectric breakdown voltage characteristic is degraded. ("Ways for Cleaning Wafer and Problems of Manufacturers of Semiconductors", Edt. Editorial Committee of Urgent Report for ULSI Production Technology, pp. 58–70,December 20, 1993, 1st Impression of 1st Edition)
The numbers in the Table are the number of particles having 0.16 $\mu$m or more of particle size per wafer.

As shown in the above, the device and method according to the present invention are used for pulling a crystal by the Czochralski method, in particular they are suitable for producing a silicon single crystal having large diameter such as 8 inches or more.

According to the present invention, it is possible to desirably control the temperature distribution and the thermal history of a pulled crystal, so that the efficiency of crystal production and the qualities of produced crystals can be improved.

We claim:
1. A device for producing a single crystal by the Czochralski method, comprising:
   a cylinder coaxially surrounding a single crystal rod, the cylinder having an upper end airtightly connected to a ceiling of a pulling chamber and a lower end positioned close to a surface of a melt in a crucible; and
   a heat insulating means attached to the lower end of the cylinder, the heat insulting means being surrounded by a surface of the crystal, an inside wall of the crucible and the surface of the melt, and the heat insulating means being sized so as to occupy about 30% by volume to 95% by volume of a space above the melt, and the space having a height corresponding to about the radius of the crystal being pulled.
2. A device for producing a single crystal according to claim 1, wherein the heat insulating means and the cylinder are removable from each other.
3. A device for producing a single crystal according to claim 2, wherein the heat insulating means comprises an outside shell defining a hollow in which a heat insulating material can be contained.
4. A device for producing a single crystal according to claim 2, wherein the shortest distances between either of the cylinder and the heat insulating means and (i) the surface of the melt, (ii) the crystal and (iii) the inside wall of the crucible, respectively, are 5 mm to 50 mm, 5 mm to 150 mm and 5 mm to 150 mm, respectively.
5. A device for producing a single crystal according to claim 1, wherein the heat insulating means comprises an outside shell defining a hollow in which heat insulating material can be contained.
6. A device for producing a single crystal according to claim 5, wherein the outside shell comprises graphite, SiC-coated graphite, SiC or $Si_3N_4$, and the hollow contains carbon fiber, glass fiber, tungsten, niobium, tantalum or molybdenum is.
7. A method for controlling a temperature distribution and thermal history of a crystal during pulling using the device of claim 3, comprising:
   providing the device of claim 3;
   dipping a seed crystal into a silicon melt in the crucible; and
   pulling the seed crystal from the melt and through the cylinder so as to grow the single crystal rod by the Czochralski method, the heat insulating means controlling the temperature distribution and thermal history of the crystal during pulling.
8. A device for producing a single crystal according to claim 5, wherein the outside shell comprises graphite, SiC-coated graphite, SiC or $Si_3N_4$, and the hollow contains no insulating material.
9. A device for producing a single crystal according to claim 1, wherein the shortest distances either of the cylinder and the heat insulating means, and (i) the surface of the melt, (ii) the crystal and (iii) the inside wall of the crucible, respectively, are 5 mm to 50 mm, 5 mm to 150 mm and 5 mm to 150 mm, respectively.
10. A method for producing a single crystal using the device according to claim 1, comprising:
    providing the device of claim 1;
    dipping a seed crystal into the melt in the crucible; and
    pulling the seed crystal from the melt and through the cylinder so as to grow the single crystal rod by the Czochralski method.
11. A method for producing a single crystal according to claim 10, wherein the heat insulating means and the cylinder are detachable from each other.

12. A method for producing a silicon single crystal using the device according to claim 1, comprising:

provide the device of claim 1;

dipping a seed crystal into a silicon melt in the crucible; and pulling the seed crystal from the melt and through the cylinder so as to grow a silicon single crystal rod by the Czochralski method.

13. A silicon single crystal produced by the method according to claim 12.

14. A method for producing a silicon single crystal according to claim 12, further comprising detaching the heat insulating means and the cylinder from each other.

15. A method for controlling a temperature distribution and thermal history of a crystal during pulling using the device of claim 1, comprising:

providing the device of claim 1;

dipping a seed crystal into a silicon melt in the crucible; and pulling the seed crystal from the melt and through the cylinder so as to grow the single crystal rod by the Czochralski method, the heat insulating means controlling the temperature distribution and thermal history of the crystal during pulling.

16. A method for controlling a temperature distribution and thermal history of a crystal during pulling according to claim 15, further comprising detaching the heat insulating means and the cylinder from each other.

17. A device for producing a single crystal by the Czochralski method, comprising:

a cylinder coaxially surrounding a single crystal rod, the cylinder having an upper end airtightly connected to a ceiling of a pulling chamber and a lower end positioned close to a surface of a melt in a crucible; and an outside shell attached to the lower end of the cylinder and being disposed substantially within the crucible, the outside shell and the cylinder defining a hollow inside space, the outside shell having an outer surface facing an inside wall of the crucible and the surface of the melt, and the outer shell and the hollow inside space being sized so as to occupy about 30% by volume to 95% by volume of a space above the melt, and the space having a height corresponding to about the radius of the crystal being pulled.

18. A device for producing a single crystal by the Czochralski method according to claim 17, wherein the hollow shell and the cylinder are detachable from each other.

* * * * *